(12) United States Patent
Fung et al.

(10) Patent No.: US 12,721,230 B2
(45) Date of Patent: Aug. 25, 2026

(54) SENSOR SYSTEM

(71) Applicant: Illumina, Inc., San Diego, CA (US)

(72) Inventors: Tracy Helen Fung, San Mateo, CA (US); Hai Quang Tran, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 397 days.

(21) Appl. No.: 18/470,900

(22) Filed: Sep. 20, 2023

(65) Prior Publication Data

US 2024/0014179 A1 Jan. 11, 2024

Related U.S. Application Data

(63) Continuation of application No. 16/949,529, filed on Nov. 2, 2020, now Pat. No. 11,784,161, which is a (Continued)

(51) Int. Cl.
*H10W 90/00* (2026.01)
*H10W 72/30* (2026.01)
(Continued)

(52) U.S. Cl.
CPC .......... *H10W 90/00* (2026.01); *H10W 72/30* (2026.01); *H10W 72/50* (2026.01); (Continued)

(58) Field of Classification Search
CPC . H01L 25/0657; H01L 23/3135; H01L 24/29; H01L 24/45; H01L 24/91; (Continued)

(56) References Cited

U.S. PATENT DOCUMENTS 4,755,667 A 7/1988 Marsoner
5,605,662 A 2/1997 Heller
(Continued)

FOREIGN PATENT DOCUMENTS

CN 103066081 4/2013
CN 105006478 10/2015
(Continued)

OTHER PUBLICATIONS

Downs, M., "Prospects for Nucleic Acid Biosensors" Biosensors, Biochemical Society Transactions, vol. 19, 1991.
(Continued)

*Primary Examiner* — Bitew A Dinke
(74) *Attorney, Agent, or Firm* — Heslin Rothenberg Farley & Mesiti P.C.

(57) ABSTRACT

A system includes an image sensor structure and a flow cell. The image sensor structure includes an image layer disposed over a base substrate. A device stack is disposed over the image layer. A bond pad is disposed in the device stack. A passivation stack is disposed over the device stack and the bond pad. An array of nanowells is disposed in a top layer of the passivation stack. A through-silicon via (TSV) is in electrical contact with the bond pad. The TSV extends through the base substrate. A redistribution layer (RDL) is disposed on a bottom surface of the base substrate. The RDL is in electrical contact with the TSV. The flow cell is disposed upon the top layer of the passivation stack to form a flow channel therebetween. The flow channel is disposed over the array of nanowells and the bond pad.

20 Claims, 14 Drawing Sheets

Related U.S. Application Data continuation of application No. 16/609,554, filed as application No. PCT/US2017/068397 on Dec. 26, 2017, now Pat. No. 10,861,829.

(51) Int. Cl.
*H10W 72/50* (2026.01)
*H10W 74/10* (2026.01)
*H10W 99/00* (2026.01)
*H10W 70/65* (2026.01)
*H10W 90/20* (2026.01)

(52) U.S. Cl.
CPC ......... *H10W 74/121* (2026.01); *H10W 99/00* (2026.01); *H10W 70/65* (2026.01); *H10W 90/297* (2026.01)

(58) Field of Classification Search
CPC . H01L 2224/02372; H01L 2225/06541; H01L 23/481; H01L 23/485; H01L 23/00; H01L 24/06; G01N 21/6454; G01N 21/00; G01N 21/6428; G01N 33/50; G01N 21/645; H10F 39/809; H10F 39/811; H10F 39/018; H10F 39/12; H10W 90/00; H10W 72/30; H10W 72/50; H10W 74/121; H10W 99/00; H10W 70/65; H10W 90/297; H10W 20/0234; H10W 20/0242; H10W 20/20; H10W 20/2134; H10W 20/40; H10W 72/90
See application file for complete search history.

(56) References Cited

U.S. PATENT DOCUMENTS 5,653,939 A 8/1997 Hollis
5,672,881 A 9/1997 Striepeke
5,843,767 A 12/1998 Beattie
5,846,708 A 12/1998 Hollis
5,854,684 A 12/1998 Stabile
5,872,623 A 2/1999 Stabile
5,894,351 A 4/1999 Colvin, Jr.
5,942,775 A 8/1999 Mannoulos
5,965,452 A 10/1999 Kovacs
6,111,248 A 8/2000 Melendez
6,117,643 A 9/2000 Simpson
6,122,042 A 9/2000 Wunderman
6,197,503 B1 3/2001 Vo-dinh
6,317,207 B2 11/2001 French
6,323,944 B1 11/2001 Xiao
6,327,410 B1 12/2001 Walt
6,403,970 B1 6/2002 Hung
6,440,722 B1 8/2002 Knapp
6,441,892 B2 8/2002 Xiao
6,448,064 B1 9/2002 Vo-dinh
6,458,547 B1 10/2002 Bryan
6,469,785 B1 10/2002 Duveneck
6,485,905 B2 11/2002 Hefti
6,566,805 B1 5/2003 Tsai
6,653,083 B2 11/2003 Emoto
6,686,150 B1 2/2004 Blackburn
6,693,269 B2 2/2004 Shimizu
6,743,581 B1 6/2004 Vo-dinh
6,784,982 B1 8/2004 Blumenfeld
6,844,563 B2 1/2005 Emoto
6,867,420 B2 3/2005 Mathies
6,867,851 B2 3/2005 Blumenfeld
6,899,137 B2 5/2005 Unger
6,905,834 B1 6/2005 Simpson
6,921,908 B2 7/2005 Reel
6,940,590 B2 9/2005 Colvin, Jr.
6,946,286 B2 9/2005 Howard
6,975,251 B2 12/2005 Pavicic
6,982,519 B2 1/2006 Guillorn
6,995,386 B2 2/2006 Emoto
7,005,264 B2 2/2006 Su
7,013,033 B2 3/2006 Arena
7,075,104 B2 7/2006 Faris
7,145,645 B2 12/2006 Blumenfeld
7,153,720 B2 12/2006 Augusto
7,163,822 B2 1/2007 Yazawa
7,170,605 B2 1/2007 Cromwell
7,179,654 B2 2/2007 Verdonk
7,190,445 B2 3/2007 Colvin, Jr.
7,221,455 B2 5/2007 Chediak
7,244,559 B2 7/2007 Rothberg
7,258,731 B2 8/2007 D'Urso
7,280,201 B2 10/2007 Helbing
7,308,292 B2 12/2007 Colvin
7,349,093 B2 3/2008 Tabata
7,371,538 B2 5/2008 Simpson
7,371,564 B2 5/2008 Kwon
7,413,852 B2 8/2008 Balch
7,416,915 B2 8/2008 Kasano
7,433,552 B2 10/2008 Kiesel
7,454,296 B2 11/2008 Wang
7,463,353 B2 12/2008 Yershov
7,466,409 B2 12/2008 Scherer
7,489,401 B2 2/2009 Kamei
7,502,123 B2 3/2009 Schmidt
7,524,459 B2 4/2009 Adams
7,541,176 B2 6/2009 Raynor
7,585,664 B2 9/2009 Chan
7,595,883 B1 9/2009 El Gamal
7,604,981 B1 10/2009 Harris, Jr.
7,609,379 B2 10/2009 Canioni
7,629,591 B2 12/2009 Nelson
7,638,182 B2 12/2009 D'Urso
7,738,086 B2 6/2010 Shepard
7,750,354 B2 7/2010 Kasano
7,767,441 B2 8/2010 Chiou
7,782,237 B2 8/2010 Ronaghi
7,811,810 B2 10/2010 Chiou
7,812,324 B2 10/2010 Connally
7,839,450 B2 11/2010 Hing
8,229,255 B2 7/2012 Wober
8,906,320 B1 12/2014 Eltoukhy
9,372,308 B1 6/2016 Saxena
9,373,732 B2 6/2016 Velichko
9,773,831 B1 9/2017 Yang
9,799,697 B2 10/2017 Lee
10,551,317 B2 2/2020 Fung
10,649,145 B2 * 5/2020 Cai .................... G01N 21/6454
10,692,908 B2 6/2020 Wu
10,861,829 B2 * 12/2020 Fung ................... H01L 23/3135
11,784,161 B2 * 10/2023 Fung ................... H01L 25/0657
257/686
2003/0108867 A1 6/2003 Chee
2007/0034777 A1 2/2007 Tuckerman
2007/0146704 A1 6/2007 Schmidt
2007/0281288 A1 12/2007 Belkin
2008/0039339 A1 2/2008 Hassibi
2008/0081769 A1 4/2008 Hassibi
2008/0176757 A1 7/2008 Hassibi
2008/0203452 A1 8/2008 Moon
2009/0075838 A1 3/2009 El Gamal
2009/0085217 A1 * 4/2009 Knickerbocker ..... H01L 23/481
257/E23.141
2009/0197326 A1 8/2009 El Gamal
2009/0258413 A1 10/2009 Moriwaki
2009/0279093 A1 11/2009 Van Herpen
2009/0284746 A1 11/2009 Klunder
2009/0325164 A1 12/2009 Vossenaar
2010/0015611 A1 1/2010 Webster
2010/0055666 A1 3/2010 Wimberger-Friedl
2010/0065726 A1 3/2010 Zhong
2010/0108865 A1 5/2010 Cho
2010/0111762 A1 5/2010 Cho
2010/0112342 A1 5/2010 Cho
2010/0122904 A1 5/2010 Hassibi
2010/0190338 A1 7/2010 Koike
2010/0200781 A1 8/2010 Khorasani
2010/0204064 A1 8/2010 Cho

(56) References Cited

U.S. PATENT DOCUMENTS

2010/0210475 A1 8/2010 Lee
2010/0230610 A1 9/2010 Van Der Zaag
2011/0102657 A1 5/2011 Takahashi
2012/0021525 A1 1/2012 Fehr
2012/0193744 A1 8/2012 Borthakur
2013/0069188 A1 3/2013 Chen
2013/0307103 A1 11/2013 Lin
2014/0084407 A1* 3/2014 Churchwell .......... H10F 39/018 257/443
2014/0225166 A1 8/2014 Ellis-Monaghan
2014/0264698 A1 9/2014 Huang
2015/0001632 A1 1/2015 Liu
2015/0054106 A1 2/2015 Chen
2015/0062420 A1 3/2015 Borthakur
2015/0079596 A1 3/2015 Eltoukhy
2015/0128703 A1* 5/2015 Kaelberer ............. B81B 7/0048 73/514.01
2015/0301039 A1 10/2015 Arsenin
2015/0311376 A1 10/2015 Yu
2015/0318323 A1 11/2015 Borthakur
2015/0329351 A1* 11/2015 Cheng ..................... B81B 7/007 438/51
2016/0181226 A1* 6/2016 Wan ........................ G01S 17/08 257/432
2016/0254312 A1 9/2016 Lee
2016/0356715 A1* 12/2016 Zhong ................. H10F 39/8057
2017/0016830 A1 1/2017 Chung
2017/0144155 A1 5/2017 Bohm
2017/0200697 A1 7/2017 Kao
2017/0207158 A1* 7/2017 Kang .................... H01L 23/481
2018/0097028 A1 4/2018 Kinsman
2018/0240797 A1* 8/2018 Yokoyama ......... H10D 84/0149
2019/0088463 A1 3/2019 Li
2019/0195797 A1 6/2019 Cai
2019/0198545 A1* 6/2019 Wu ....................... H10F 39/026
2019/0198553 A1 6/2019 Cai
2020/0066684 A1 2/2020 Fung
2020/0091217 A1 3/2020 Horikoshi
2020/0127029 A1 4/2020 Meynants
2020/0164360 A1 5/2020 Rival
2020/0166461 A1 5/2020 Fung
2021/0050329 A1 2/2021 Fung
2024/0014179 A1* 1/2024 Fung ....................... H01L 24/91

FOREIGN PATENT DOCUMENTS

CN 105980832 9/2016
CN 106353285 1/2017
CN 106471621 3/2017
CN 107265391 10/2017
JP 2010273757 12/2010
JP 2015222810 12/2015
JP 2017504789 2/2017
JP 2017183388 10/2017
RU 2527699 9/2014
TW 200727466 7/2007
WO 1998029736 7/1998
WO 2000004372 1/2000
WO 2012058096 5/2012
WO 2016168996 10/2016

OTHER PUBLICATIONS

Kunz, R., "Totally Integrated Optical Measuring Sensors" SPIE vol. 1587 Chemical, Biochemical, and Environmental Fiber Sensors III, 98-113, 1991.
Eggers et al., "A Microchip for Quantitative Detection of Molecules Utilizing Luminescent and Radioisotope Reporter Groups" BioTechniques, vol. 17 (3) 516-524, 1994.
Lamture et al., "Direct Detection of Nucleic Acid Hybridization on the Surface of a Charge Coupled-Device" Nucleic Acids Research, 22 (11), 2121-2125, 1994.
Eggers et al., "A Review of Microfabricated Devices for Gene-Based Diagnostics" Hematologic Pathology, 9 (1), 1-15, 1995.
Eggers, M. et al., "A Versatile Biochip for Gene-Based Diagnostics" Professional Program Proceedings, ELECTRO'96, IEEE, 87-92, 1996.
Burns et al., "Microfabricated Structures for Integrated DNA Analysis" Proc. Natl. Acad. Sci. vol. 93, 5556-5561, May 1996.
Kunz, R., "Miniature Integrated Optical Modules for Chemical and Biochemical Sensing" Sensors and Actuators B 38-39, 13-28, 1997.
Schmalzing et al., "DNA Typing in Thirty Seconds with a Microfabricated Device" Proc. Natl. Acad. Sci,, vol. 9, 10273-10278, Sep. 1997.
Caillat et al., "SA 17.1: Active CMOS Biochips: An Electro-Addressed DNA Probe" IEEE International Solid-State Circuits Conference, Digest of Technical Papers, ISSCC, First Edition, 1998.
Mastrangelo et al., "Microfabricated Devices for Genetic Diagnostics" Proceedings of the IEEE, vol. 8 (8), 1769-1787, Aug. 1998.
Caillat et al., "Biochips on CMOS: An Active Matrix Address Array for DNA Analysis" Sensors and Actuators B 61, 154-162, 1999.
Vo-Dinh et al., "DNA Biochip Using a Phototransistor Integrated Circuit" Anal. Chem., 71, 358-363, Jan. 1999.
Marguiles et al., "Genome Sequencing in Open Microfabricated High Density Picoliter Reactors" Nature 437, 376-380, Jul. 2005.
Leamon et al., "Cramming More Sequencing Reactions onto Microreactor Chips" Chem. Rev., vol. 107, 3367-3376, Jul. 2007.

* cited by examiner 100
156
154
152
118
142
144
144
110
190
120
148
146
150
104

100
114
164
162
160
156
154
152
110
118
142
144
144
148
146
150
110
104

100
108
108
114
156
154
152
110
118
168
142
144
144
172
168
148
146
150
110
168
104
172

100
104
108
110
114
118
142
144
146
148
150
152
154
156
168
170
172
174
176
182

100
114
156
154
152
110
118
168
142
144
144
172
174
176
178
148
146
150
182
108
170
174
194

100
112
114
156
154
152
110
118
168
142
144
144
172
174
178
106
148
146
150
170
174
194
126
108
102
110
168
172
174
178
104

100
102
104
106
108
110
112
114
116
118
124
126
142
144
146
148
150
152
154
156
158
168
170
172
174
176
178
180
182
184
186

SENSOR SYSTEM

CROSS REFERENCE TO RELATED APPLICATION

This application is a continuation of U.S. application Ser. No. 16/949,529, filed on Nov. 2, 2020, which is a continuation of U.S. application Ser. No. 16/609,554, filed on Oct. 30, 2019, which is a National Phase filing under 35 U.S.C. § 371 of International Application No. PCT/US2017/068397, filed on Dec. 26, 2017. The entire contents of each of the aforementioned applications are incorporated herein by reference.

BACKGROUND

A sensor system, for example a biosensor system, may include a flow cell disposed on a top layer of a passivation stack of layers (herein the "passivation stack") of an image sensor structure, wherein the flow cell and the passivation stack form a flow channel therebetween. Such sensor systems often utilize high density arrays of nanowells disposed in the top layer of the passivation stack, and within the flow channel of the flow cell, to perform controlled reaction protocols on analytes disposed within the nanowells.

In an example of such a reaction protocol, analytes (such as clusters of DNA segments, nucleic-acid molecular chains, or the like) that are disposed in a nanowell array of an image sensor structure may be tagged with an identifiable label (such as a fluorescently labeled molecule) that is delivered to the analytes via fluid flow through the flow channel. One or more excitation lights can then be directed onto the labeled analytes within the nanowells. The analytes may then emit photons of an emissive light, which may be transmitted through the passivation stack and into light guides of the image sensor structure that are associated (e.g., located directly below) with each nanowell.

A top surface of each light guide is in direct contact with the bottom surface of the passivation stack, wherein each light guide's top surface receives a significant portion of the emissive light photons transmitted from its associated nanowell. The light guides direct the emissive light photons to light detectors disposed within the image sensor structure and associated (e.g., located directly below) with the light guides. The light detectors detect the emissive light photons. Device circuitry within the image sensor structure then processes and transmits data signals using those detected photons. The data signals may then be analyzed to reveal properties of the analytes. Examples of such reaction protocols include high-throughput DNA sequencing for the health and pharmaceutical industries and more.

As the need for increasing the data throughput generated from such reaction protocols continuously grows, so does the need to continuously reduce the size of nanowells in nanowell arrays in an image sensor structure and increase the number of nanowells in the nanowell arrays. Additionally, as the need to reduce the size and increase the number of nanowells grows, it becomes increasingly more critical that surface chemistry, required to prepare for and conduct such chemical reactions, be compatible with electronic components (such as bond pads) within the sensor system.

BRIEF DESCRIPTION

The present disclosure offers advantages and alternatives over the prior art by providing a sensor system, such as, for example, a biosensor system, including bond pads disposed under a passivation stack of an image sensor system. Because the bond pads are protected by the passivation stack, the flow channel area of the sensor system is no longer restricted by the bond pads and may be enlarged such that it is disposed over the bond pads as well as the nanowells. Accordingly, the number of nanowells that can fit under the flow channel for an image sensor structure having a fixed footprint can be increased.

A system in accordance with one or more aspects of the present disclosure includes an image sensor structure and a flow cell. The image sensor structure includes an image layer disposed over a base substrate. A device stack is disposed over the image layer. A bond pad is disposed in the device stack. A passivation stack is disposed over the device stack and the bond pad. An array of nanowells is disposed in a top layer of the passivation stack. A through-silicon via (TSV) is in electrical contact with the bond pad. The TSV extends through the base substrate. A redistribution layer (RDL) is disposed on a bottom surface of the base substrate. The RDL is in electrical contact with the TSV. The flow cell is disposed upon the top layer of the passivation stack to form a flow channel therebetween. The flow channel is disposed over the array of nanowells and the bond pad.

Another system in accordance with one or more aspects of the present disclosure includes a flow cell and an image sensor structure. The image sensor structure includes an image layer disposed over a base substrate. The image layer includes an array of light detectors disposed therein. A device stack is disposed over the image layer. A plurality of bond pads is disposed in the device stack. An array of light guides is disposed in the device stack. A passivation stack is disposed over the device stack and the plurality of bond pads. An array of nanowells is disposed in a top layer of the passivation stack. A through-silicon via (TSV) is in electrical contact with the bond pads of the plurality of bond pads. The TSV extends through the base substrate. A redistribution layer (RDL) is disposed on a bottom surface of the base substrate. The RDL is in electrical contact with the TSV. A flow cell is disposed upon the top layer of the passivation stack to form a flow channel therebetween. The flow channel is disposed over the array of nanowells and the plurality of bond pads.

A method in accordance with one or more aspects of the present disclosure includes disposing a device stack and an image layer over a base substrate layer. A bond pad is disposed in the device stack. A passivation stack is disposed over the device stack and the bond pad. An array of nanowells is formed in a top layer of the passivation stack. A TSV is etched through a bottom surface of the base substrate. The TSV extends to the bond pad. The TSV is plated to make electrical contact with the bond pad. An RDL is disposed on the bottom surface of the base substrate. The RDL is in electrical contact with the TSV. A flow cell is disposed upon the top layer of the passivation stack to form a flow channel therebetween. The flow channel is disposed over the array of nanowells and the bond pad.

DRAWINGS

The disclosure will be more fully understood from the following detailed description taken in conjunction with the accompanying drawings, in which.

Figure 12:
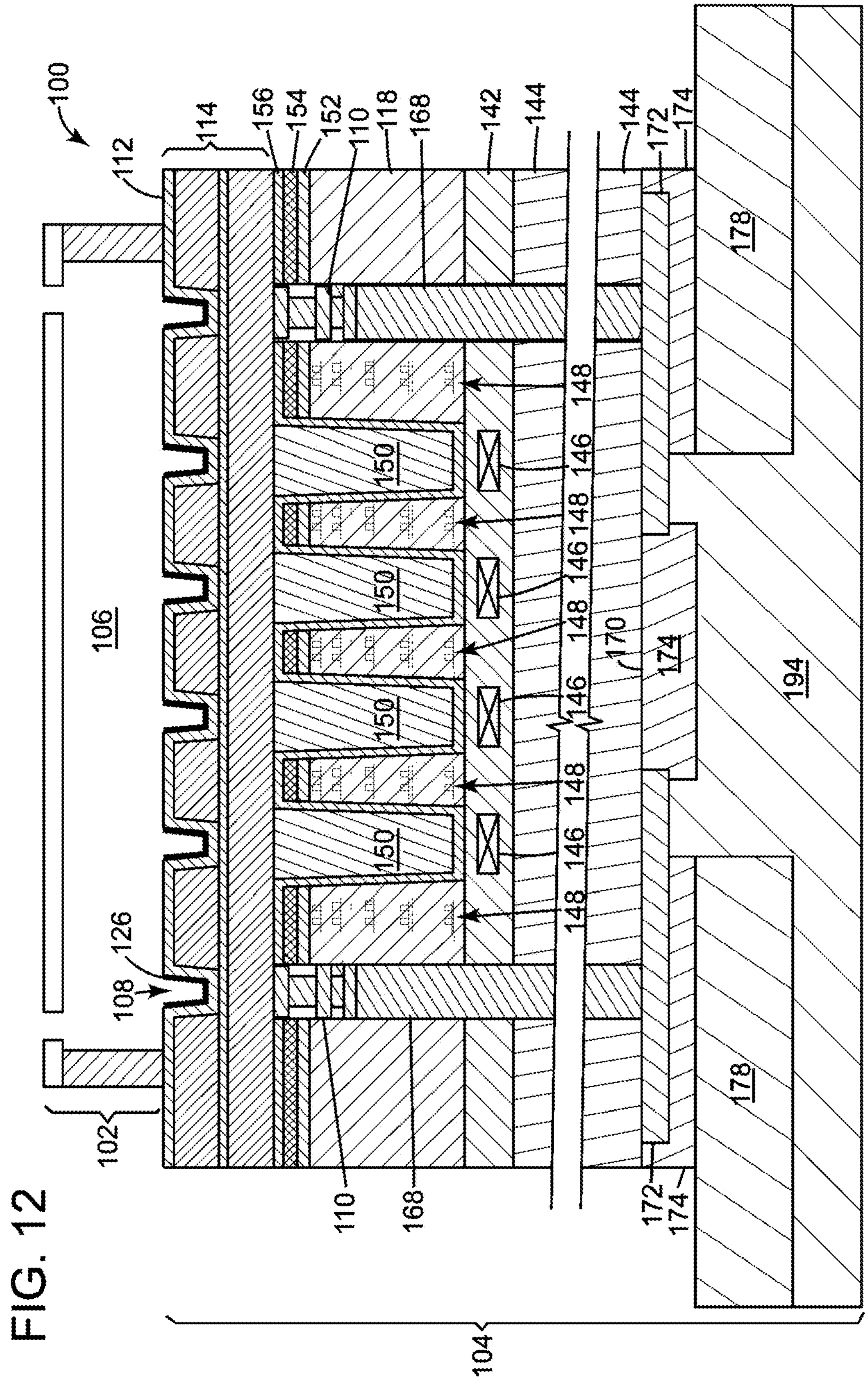
FIG. 12 is a simplified cross sectional view of the sensor system of FIG. 11, wherein the flow cell is bonded to the image sensor structure in accordance with one example disclosed herein.
Figure 13:
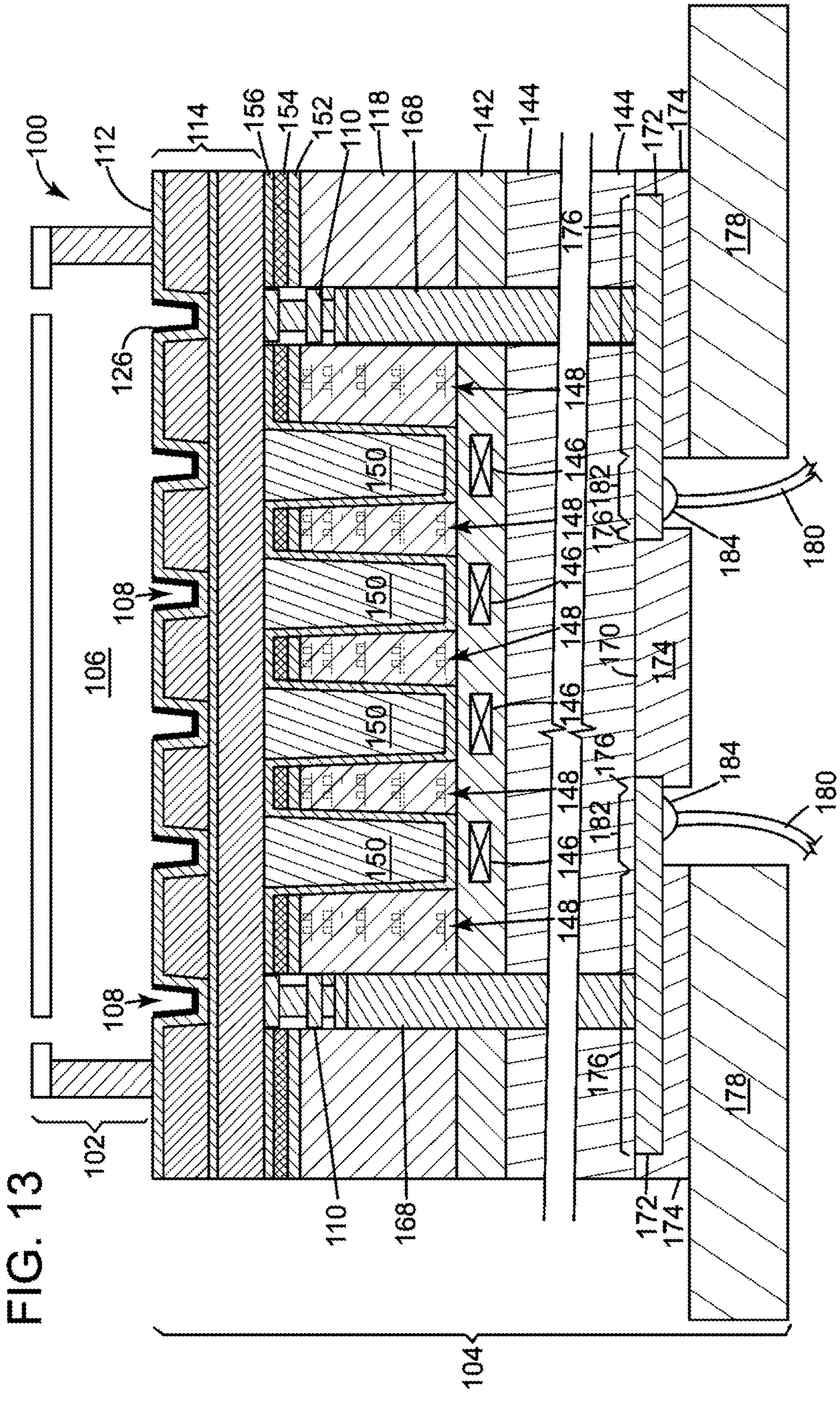
Figure 14:
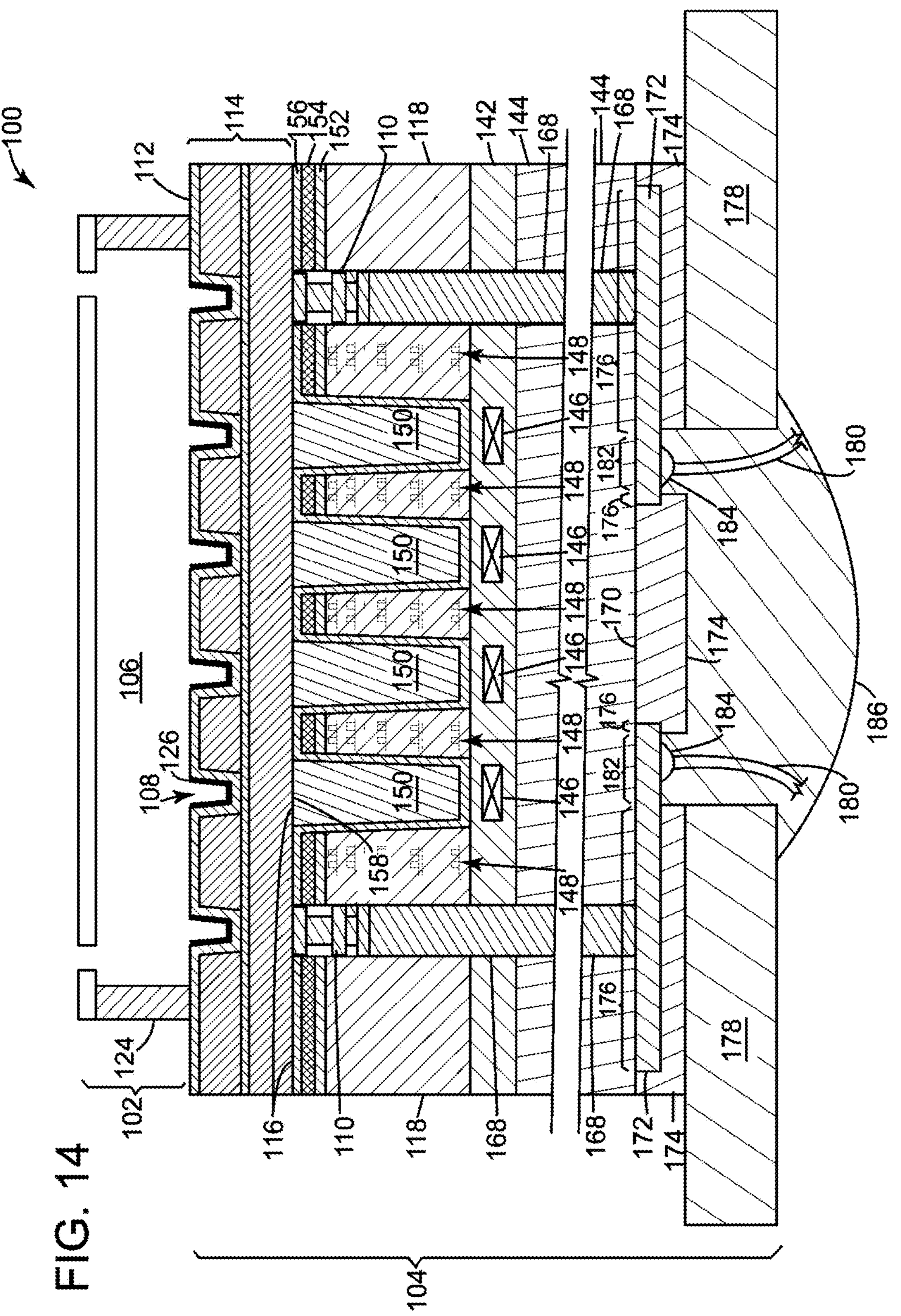

FIG. 13 is a simplified cross sectional view of the sensor system of FIG. 12, wherein wires are bonded to a $2^{nd}$ portion of the RDL in accordance with one example disclosed herein; and FIG. 14 is a simplified cross sectional view of the sensor system of FIG. 13, wherein a $2^{nd}$ environmental protection layer is disposed over the $2^{nd}$ portion of the RDL and the bonded wires to complete the formation of the sensor system in accordance with one example disclosed herein.

DETAILED DESCRIPTION

Certain examples of will now be described to provide an overall understanding of the principles of the structure, function, manufacture, and use of the methods, systems, and devices disclosed herein. One or more examples are illustrated in the accompanying drawings. Those skilled in the art will understand that the methods, systems, and devices specifically described herein and illustrated in the accompanying drawings are non-limiting examples and that the scope of the present disclosure is defined solely by the claims. The features illustrated or described in connection with one example may be combined with the features of other examples. Such modifications and variations are intended to be included within the scope of the present disclosure.

The terms “substantially”, “approximately”, “about”, “relatively” or other such similar terms that may be used throughout this disclosure, including the claims, are used to describe and account for small fluctuations, such as due to variations in processing. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Examples provided herein relate to sensor systems and methods of making the same. More specifically, examples provided herein relate to sensor systems having a flow channel disposed over nanowells and bond pads.

Figure 1:
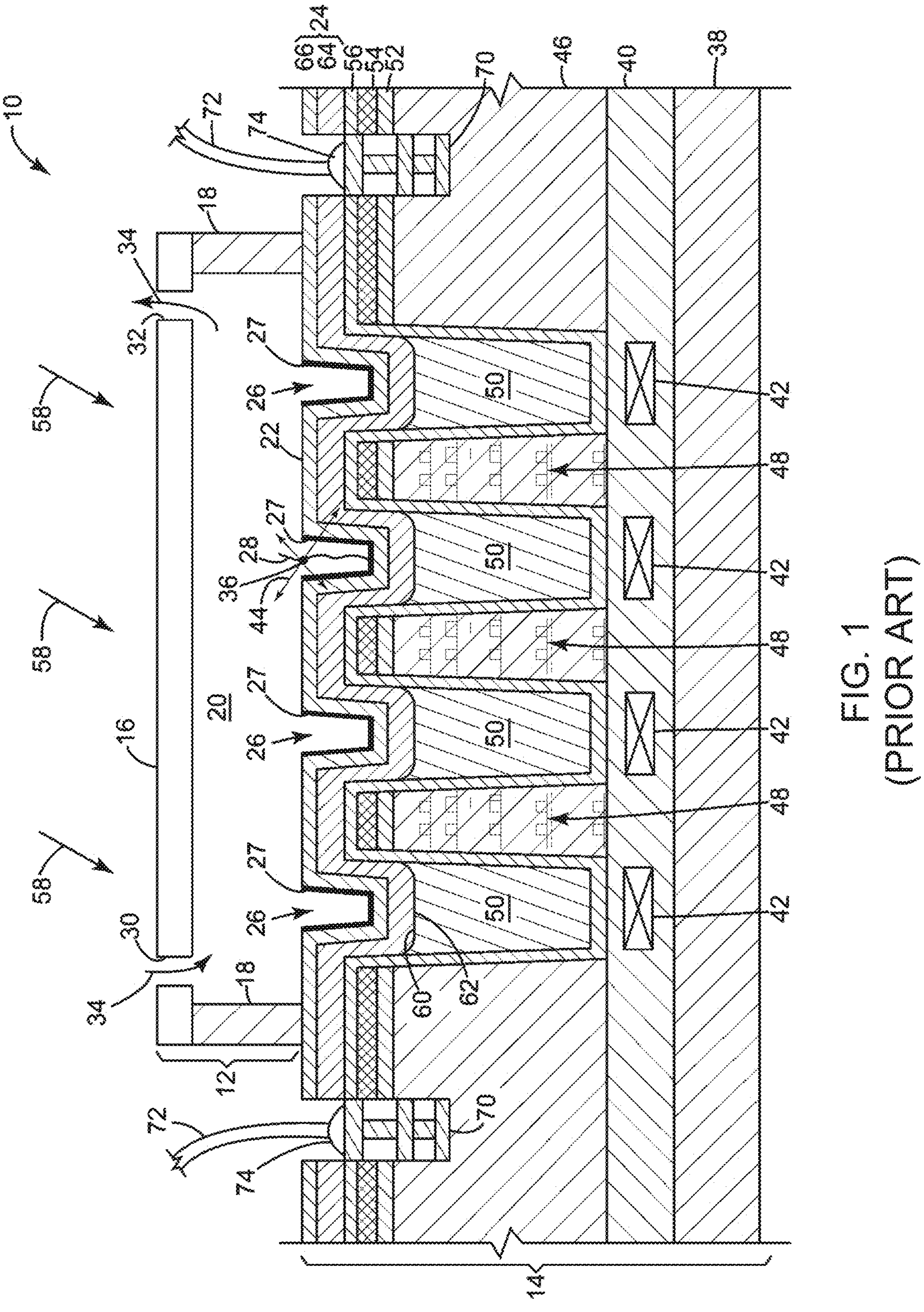
FIG. 1 is a simplified cross sectional side view of an example of one type of a sensor system having a flow cell disposed on an image sensor structure to form a flow channel therebetween, the image sensor structure having an array of nanowells disposed within the flow channel, the image sensor structure also having bond pads disposed external to the flow channel.
Figure 2:
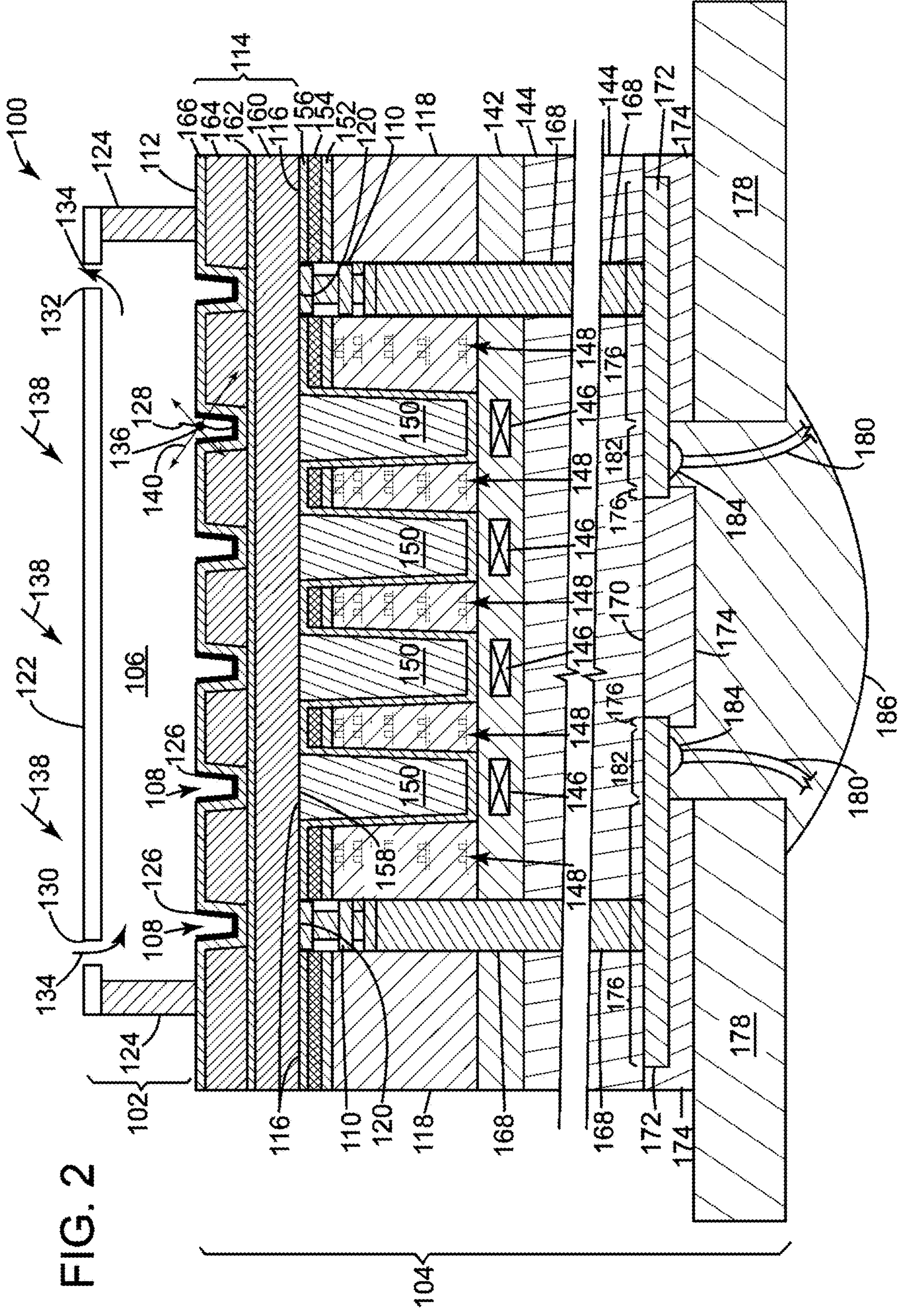
FIG. 2 is a simplified cross sectional side view of a sensor system having a flow cell disposed on an image sensor structure to form a flow channel therebetween, the image sensor structure including an array of nanowells disposed within the flow channel, the image sensor structure also including bond pads disposed within the flow channel in accordance with one example disclosed herein.

FIG. 1 illustrates a prior art sensor system having nanowells disposed within a flow channel and bond pads disposed external to the flow channel. FIG. 2 illustrates an example of a sensor system having a flow channel disposed over nanowells and bond pads in accordance with the present disclosure. FIGS. 3-14 illustrate various examples of methods of making the sensor system of FIG. 2 in accordance with the present disclosure.

Referring to FIG. 1, an example of one type of a sensor system 10 (which, in this example, is a biosensor system 10) includes a flow cell 12 bonded to an image sensor structure 14. The flow cell 12 of the sensor system 10 includes a flow cell cover 16 affixed to flow cell sidewalls 18. The flow cell sidewalls 18 are bonded to a top layer 22 of a passivation stack 24 of the image sensor structure 14 to form a flow channel 20 therebetween.

The top layer 22 of the passivation stack 24 includes a large array of nanowells 26 disposed therein. The nanowells 26 include a thin layer of hydrogel 27 which conforms to the inner surfaces of the nanowells 26. The hydrogel layer 27 is used to aid in anchoring and functionalizing analytes 28 (such as DNA segments, oligonucleotides, other nucleic-acid chains or the like), which may be disposed within the nanowells 26.

The flow cell cover includes an inlet port 30 and an outlet port 32 that are sized to allow fluid flow 34 into, through and out of the flow channels 20. The fluid flow 34 may be utilized to perform a large number of various controlled reaction protocols on the analytes 28 disposed within the nanowells 26. The fluid flow 34 may also deliver an identifiable label 36 (such as a fluorescently labeled nucleotide molecule or the like) that can be used to tag the analytes 28.

The image sensor structure 14 of the sensor system 10 includes an image layer 40 disposed over a base substrate 38. The image layer 38 may be a dielectric layer, such as silicon nitride ($Si_xN_x$) and may contain an array of light detectors 42 disposed therein. A light detector 42 as used herein may be, for example, a semiconductor, such as a photodiode, a complementary metal oxide semiconductor (CMOS) material, or both. The light detectors 42 detect light photons of emissive light 44 that is emitted from the fluorescent labels 36 attached to the analytes 28 in the nanowells 26. The base substrate 38 may be glass, silicon or other like material.

A device stack 46 is disposed over the image layer 40. The device stack 44 may contain a plurality of dielectric layers (not shown) that contain various device circuitry 48 which interfaces with the light detectors 42 and processes data signals using the detected light photons of the emissive light 44.

Also disposed in the device stack 46 is an array of light guides 50. Each light guide 50 is associated with at least one light detector 42 of the array of light detectors. For example, the light guide 50 may be located directly over its associated light detector 42. The light guides 50 direct photons of emissive light 44 from the fluorescent labels 36 on the analytes 28 disposed in the nanowells 26 to their associated light detectors 42.

Also disposed within the device stack 46, is a light shield layer 52, an anti-reflective layer 54 and a protective liner layer 56. The protective liner layer 56, may be composed of a silicon nitride (SiN) or silicon dioxide ($SiO_2$), and lines the inside walls of the light guides 50. The light shield layer 52, may be composed of tungsten (W) or Aluminum (Al) and attenuates emissive light 44 and excitation light 58 transmitted into the device stack 46. The anti-reflective layer 54, may be composed of a tungsten nitride (WN) or silicon oxynitride (SiON) for photolithographic patterning of a metal layer underneath.

The passivation stack 24 is disposed over the device stack 46. The passivation stack 24 includes a bottom surface 60 that is in direct contact with a top surface 62 of the light guides 50. The passivation stack 24, may include a passivation layer 64 and a chemical protection layer 66 (which in this case is the top layer 22 of the passivation stack 24). The passivation layer 64, may be composed of SiN and include the bottom surface 60 of the passivation stack 24. The chemical protection layer 66, may be composed of a tantalum pentoxide ($Ta_2O_5$) and be the top layer 22 of the passivation stack 24.

The array of nanowells 26 is also disposed in the top layer 22 of the passivation stack 24, wherein each nanowell 26 is associated with a light guide 50 of the array of light guides. For example, each nanowell 26 may be located directly above an associated light guide 50, such that most of the photons of emissive light 44 that enter the top surface 62 of each light guide 50 are generated from within that light guide's associated nanowell 26. Additionally the array of nanowells 26 is disposed within the flow channel 20.

A plurality of bond pads 70 is also disposed in the device stack 46. The bond pads 70 may be composed of one or more layers of pad metals (not shown). The bond pads interface with the device circuitry 48 to conduct the data signals, which were processed using the detected light photons, to wires 72 bonded to the bond pads 70.

During operation, various types of excitation light 58 is radiated onto the analytes 28 in the nanowells 26, causing the labeled molecules 36 to fluoresce emissive light 44. The majority of photons of emissive light 44 may be transmitted through the passivation stack 24 and enter the top surface 62 of its associate light guide 50. The light guides 50 may filter out most of the excitation light 58 and direct the emissive light 44 to an associated light detector 42 located directly below the light guide 50.

The light detectors 42 detect the emissive light photons. The device circuitry 48 within the device stack 46 then processes and transmits data signals using those detected photons. The data signals may then be transmitted through the bond pads 70 and analyzed to reveal properties of the analytes.

The bond pads 70 may be bonded to wires 72 through wire bonds 74 disposed on the top layer 22 of the passivation stack 24 to enable transmission of the data signals externally. This may be done by forming a eutectic metal bond through wire bonding or solder bump bonding. Additionally, the surface of the nanowells 26 may be chemically functionalized, as for example with the deposition of the hydrogel layer 27, in order to be able to receive the analytes 28 that may be disposed in the nanowells 26.

However, the processes for preparing the bond pads 70 on the top layer 22 of the passivation stack 24 for such wire bonding techniques may contaminate the surface functionalization of the nanowells. Further the chemical functionalization of the nanowells may deposit residue on, and/or potentially corrode, the open bond pads. Also, the fluid flow 34 through the flow channel 20 that is used during a variety of controlled reaction protocols may potentially damage, and/or corrode, any bond pads 70 that are exposed to such fluid flow 34. Moreover, it may be difficult to electrically connect the wires 72 to the bond pads 70 at the top layer 22 of the passivation stack 24, if the wires 70 had to extend into the flow channel 20.

For at least the above reasons, the bond pads 70 are disposed on the top layer 22 of the passivation stack 24 external to the flow channel 20 of the flow cell 12. Accordingly, bonding wires or solder bumps to the bond pads 70 limit the size of the flow channel 20, which also limits the amount of nanowells 26 that can be disposed within the flow channel 20 for a sensor system 10 that has a fixed footprint.

The example sensor systems described herein differ from some pre-existing sensor systems in several aspects. For example, that the bond pads 70 of some examples herein are disposed within the flow channel 20. Additionally, the examples herein provide extending the flow channel 20 over the bond pads 70 to cover a larger surface area in the same biosensor footprint. Additionally, the examples herein provide mechanisms to protect the bond pads 70 from being damaged, and/or corroded, by exposure to fluid flow 34 through the flow channel 20.

Referring to FIG. 2, a cross sectional side view of an example of a sensor system 100 having a flow cell 102 disposed on an image sensor structure 104 to form a flow channel 106, which extends over an array of nanowells 108 and a plurality of bond pads 110, is illustrated. The array of nanowells 108 is disposed in a top layer 112 of a passivation stack 114 of the image sensor structure 104. The plurality of bond pads 110 is disposed under a bottom surface 116 of the passivation stack 114. More specifically, the bond pads 110 are disposed in a device stack 118, wherein a top surface 120 of the bond pads 110 is disposed below the bottom surface 116 of the passivation stack.

The flow cell 102 of the sensor system 100 includes a flow cell cover 122 affixed to flow cell sidewalls 124. The flow cell sidewalls 124 are bonded to the top layer 112 of the passivation stack 114 of the image sensor structure 104 to form the flow channel 106 therebetween.

The top layer 112 of the passivation stack 114 includes the large array of nanowells 108 disposed therein. The nanowells 108 include a thin layer of hydrogel 126 within the nanowells 108. The hydrogel layer 126 is used to anchor and functionalize analytes 128 (such as DNA segments, oligonucleotides, other nucleic-acid chains or the like), which may be disposed within the nanowells 108.

The flow cell cover 122 includes an inlet port 130 and an outlet port 132 that are sized to allow fluid flow 134 into, through and out of the flow channels 106. The fluid flow 134 may be utilized to perform a large number of various controlled reaction protocols on the analytes 128 disposed within the nanowells 106. The fluid flow 134 may also deliver an identifiable label 136 (such as a fluorescently labeled nucleotide molecule or the like) that can be used to tag the analytes 128. During various controlled reaction protocols, an excitation light 138 may be directed upon the fluorescent labels 136, which causes the labels 136 to fluoresce an emissive light 140.

The image sensor structure 104 of the sensor system 100 includes an image layer 142 disposed over a base substrate 144. The image layer 142 may be a dielectric layer, such as SiN and may contain an array of light detectors 146 disposed therein. A light detector 146 as used herein may be, for example, a semiconductor, such as a photodiode, a complementary metal oxide semiconductor (CMOS) material, or both. The light detectors 146 detect light photons of the emissive light 140 that are emitted from the fluorescent labels 136 attached to the analytes 128 in the nanowells 108. The base substrate 144 may be glass, silicon or other like material.

The device stack 118 is disposed over the image layer 142. The device stack 118 may contain a plurality of dielectric layers (not shown) that contain various device circuitry 148 which interfaces with the light detectors 146 and processes data signals using the detected light photons of the emissive light 140.

Also disposed in the device stack 118 is an array of light guides 150. Each light guide 150 is associated with at least one light detector 146 of the array of light detectors. For example, the light guide 150 may be located directly over its associated light detector 146. The light guides 150 direct photons of emissive light 140 from the fluorescent labels 136 on the analytes 128 disposed in the nanowells 108 to their associated light detectors 146.

The light guide 150 may be an organic filter material that is capable of filtering out the known wavelengths of excitation light 138 and transmitting through known wavelengths of emissive light 140. The light guide material may be composed of custom formulated dye molecules arranged in a high index polymer matrix.

Also disposed within the device stack 118, is a light shield layer 152, an anti-reflective layer 154 and a protective liner layer 156. The protective liner layer 156, may be composed of a dielectric material, such as silicon nitride (SiN) or other similar materials, and lines the inside walls of the light guides 150. The light shield layer 152, may be composed of a transition metal, such as tungsten (W) or other similar materials, and attenuates emissive light 140 and excitation light 138 transmitted into the device stack 118. The anti-reflective layer 154, may be composed of an anti-reflective compound, such as tungsten nitride (WN) or silicon oxynitride (SiON), or other similar materials, and be used for photolithographic patterning of a metal layer underneath.

The passivation stack 114 is disposed over the device stack 118. The passivation stack 114 includes the bottom surface 116 that is in direct contact with a top surface 158 of the light guides 150 and that is over the top surface 120 of the bond pads 110. The passivation stack also includes the top layer 112 into which the nanowells 108 are disposed.

The passivation stack 114, may include any number of layers. For example, the passivation stack 114 may include a $1^{st}$ passivation layer 160 that is disposed over the device stack 118 and a $1^{st}$ chemical protection layer 162 that is disposed over the $1^{st}$ passivation layer 160. In this example, the top layer 112 of the passivation stack 114 is the $1^{st}$ chemical protection layer 162, which includes the nanowells 108 disposed therein.

However, in the specific example illustrated in FIG. 2, the passivation stack 114 includes an additional $2^{nd}$ passivation layer 164 disposed over the $1^{st}$ chemical layer 162 plus an additional $2^{nd}$ chemical protection layer 166 disposed over the $2^{nd}$ passivation layer 164. In this specific FIG. 2 example, the top layer 112 of the passivation stack 114 is the $2^{nd}$ chemical protection layer 166, wherein the nanowells 108 are disposed in the $2^{nd}$ chemical protection layer 166.

The passivation layers 160, 164, may be composed of SiN. The chemical protection layers 162, 166, may be composed of a transition metal oxide, such as tantalum pentoxide ($Ta_2O_5$) or other similar materials.

Each nanowell 108, of the array of nanowells, is associated with a light guide 150 of the array of light guides. For example, each nanowell 108 may be located directly above an associated light guide 150, such that most of the photons of emissive light 140 that enters the top surface 158 of each light guide 150 is generated from within that light guide's associated nanowell 108. Additionally the array of nanowells 108 is disposed within the flow channel 106.

The plurality of bond pads 110 is also disposed in the device stack 118. Though only two bond pads 110 are illustrated in FIG. 2, there can be any number of bond pads 110, from one bond pad to hundreds of bond pads and more. The bond pads 110 may be composed of one or more layers (not shown) of pad metals, such as any suitable metals, including tungsten, copper, or other similar materials.

Through-silicon via (TSV) 168 are disposed in electrical contact with the bond pads 110. The TSV 168 extend from the bond pads 110 through the base substrate 144 to a bottom surface 170 of the base substrate 144. The TSV may be composed of transition metal, such as tungsten or other similar materials.

A redistribution layer (RDL) 172 is disposed on the bottom surface 170 of the base substrate 144. The RDL 172 is in electrical contact with the TSV 168. The RDL may be composed of a metal, such as tungsten, copper, gold nickel, or other similar materials.

A $1^{st}$ environmental protection layer 174 is disposed over a $1^{st}$ portion 176 of the RDL 172. The $1^{st}$ environmental protection layer may be composed of polyimide.

Mechanical support structures 178 are disposed over the $1^{st}$ environmental protection layer 174. The mechanical support layers 178 may be composed of a wafer, such as silicon wafer, glass wafer, or other similar materials.

Wires 180 are bonded in electrical contact to a $2^{nd}$ portion 182 of the RDL 172 to form wire bonds 184. This may be done by forming a eutectic metal bond through wire bonding, solder bump bonding or by utilizing other well-known wire connection techniques. The wires 180 may comprise an electrically conductive material, such as copper, or other similar materials.

A $2^{nd}$ environmental protection layer 186 is disposed over the $2^{nd}$ portion 182 of the RDL 172, wherein the P t and $2^{nd}$ environmental protection layers 174, 186 cover the entire RDL 172. The $2^{nd}$ environmental protection layer 186 may be composed of a polymer, such as epoxy, UV curable polymer, or other similar materials.

During operation of a controlled reaction protocol, nanowells 108 receive analytes 128 that are tagged with a fluorescent molecular label 136. The fluorescent labels 136 are delivered to the analytes via the fluid flow 134 through the flow channel 106. The fluorescent labels 136 generate emissive light 140 in response to an excitation light 138. Photons of the emissive light 140 are transmitted from a nanowell 108, through the passivation stack 114, and into the top surface 158 of an associated light guide 150, which may be located directly below the nanowell 108. The photons of emissive light 140 are then guided by the associated light guide 150 to an associated light detector 146, which may be located directly below the light guide 150. The associated light detectors 146 detect the photons of emissive light 140. Additionally, device circuitry 148 is integrated with the light detectors 146 to process the detected emissive light photons and provide data signals using the detected emissive light photons. The device circuitry 148 is also integrated with the bond pads 110 such that the data signals are transmitted through the bond pads 110, through the TSV 168 and out the wires 180 located on the bottom surface 170 of the base substrate 114, wherein those data signals can then be analyzed.

During many such controlled reaction protocols, the fluid flow 134 may be damaging, and/or corrosive, to any exposed areas of the bond pads 110. However, the bond pads 110 in this example of FIG. 2 are protected by the passivation stack 114, which is disposed over the bond pads 110. Therefore, the flow channel 106 may be disposed over the bond pads 110, since the passivation stack 114 is disposed between the flow channel 106 and the bond pads 110. Additionally, the flow cell 102 area can be expanded over the bond pads 110 to increase the number of nanowells 108 disposed within the flow channel 106 and to increase throughput of the sensor system 100 without increasing the footprint of the sensor system 100.

Figure 3:
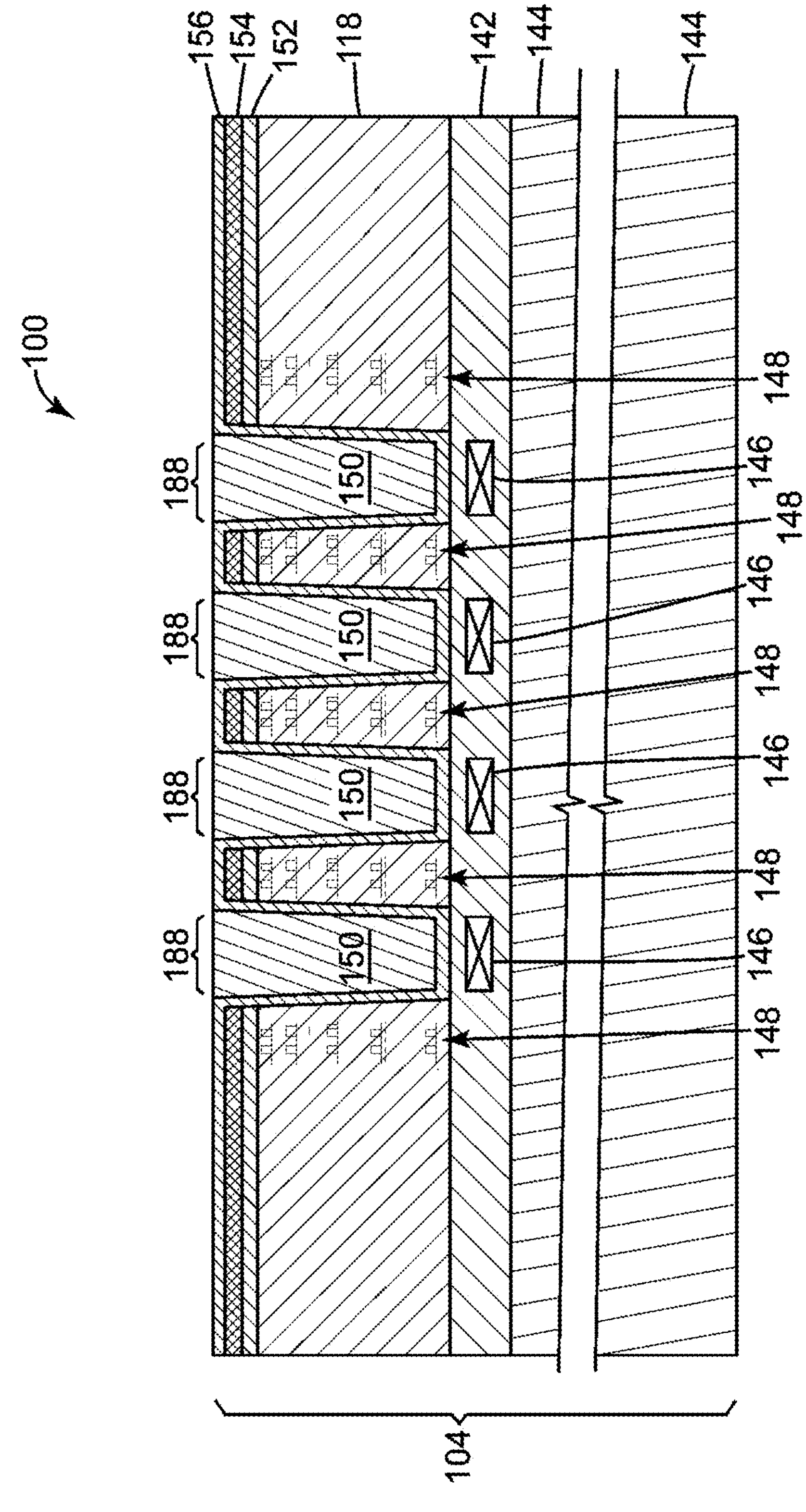
FIG. 3 is a simplified cross sectional view of the sensor system of FIG. 2 at an intermediate stage of manufacture, wherein the image sensor structure includes light guides disposed in a device stack and the device stack disposed on a base substrate in accordance with one example disclosed herein.

Referring to FIG. 3, a cross sectional side view of an example of sensor system 100 at an intermediate stage of manufacture is illustrated. At this stage of the process flow, the device stack 118 and image layer 142 are disposed respectively over the base substrate layer 144.

The image layer includes the array of light detectors 146 disposed therein. The image layer 142 can be disposed over the base substrate 144 using any one of several deposition techniques, such as chemical vapor deposition (CVD) or physical vapor deposition (PVD).

The multiple dielectric layers (not shown) of the device stack 118, with its associated device circuitry 148, can also be disposed over the image layer 142 using deposition techniques. The light shield layer 152 and the anti-reflective layer 154 may thereafter be disposed over the device stack 118 using any suitable deposition techniques, such as CVD, PVD, atomic layer deposition (ALD) or electro-plating.

Thereafter in the process flow, an array of light guide apertures 188 are etched into the device stack 118. This can be done using any suitable etching processes, such as an anisotropic etching process, such as reactive ion etching (RIE). An etching process in this disclosure may include patterning, such as lithographical patterning.

The protective liner layer 156 can then be disposed over the partially formed image sensor structure 104, including the inner surfaces of the apertures 100. This can be done using any suitable deposition techniques, such as CVD, PVD or ALD.

Thereafter in the process flow, a light guide layer (not shown) is disposed over the entire structure 100 to fill the apertures 188. The light guide layer may be composed of an organic filter material that is capable of filtering out the known wavelengths of excitation light 138 and transmitting through known wavelengths of emissive light 140.

The light guide layer is thereafter planarized down to complete the formation of the array of light guides 150 in the light guide apertures 188. Each light guide 150 being associated with at least one light detector 146 of the array of light detectors. This may be done using any suitable polishing techniques, such as a chemical mechanical polishing process.

Figure 4:
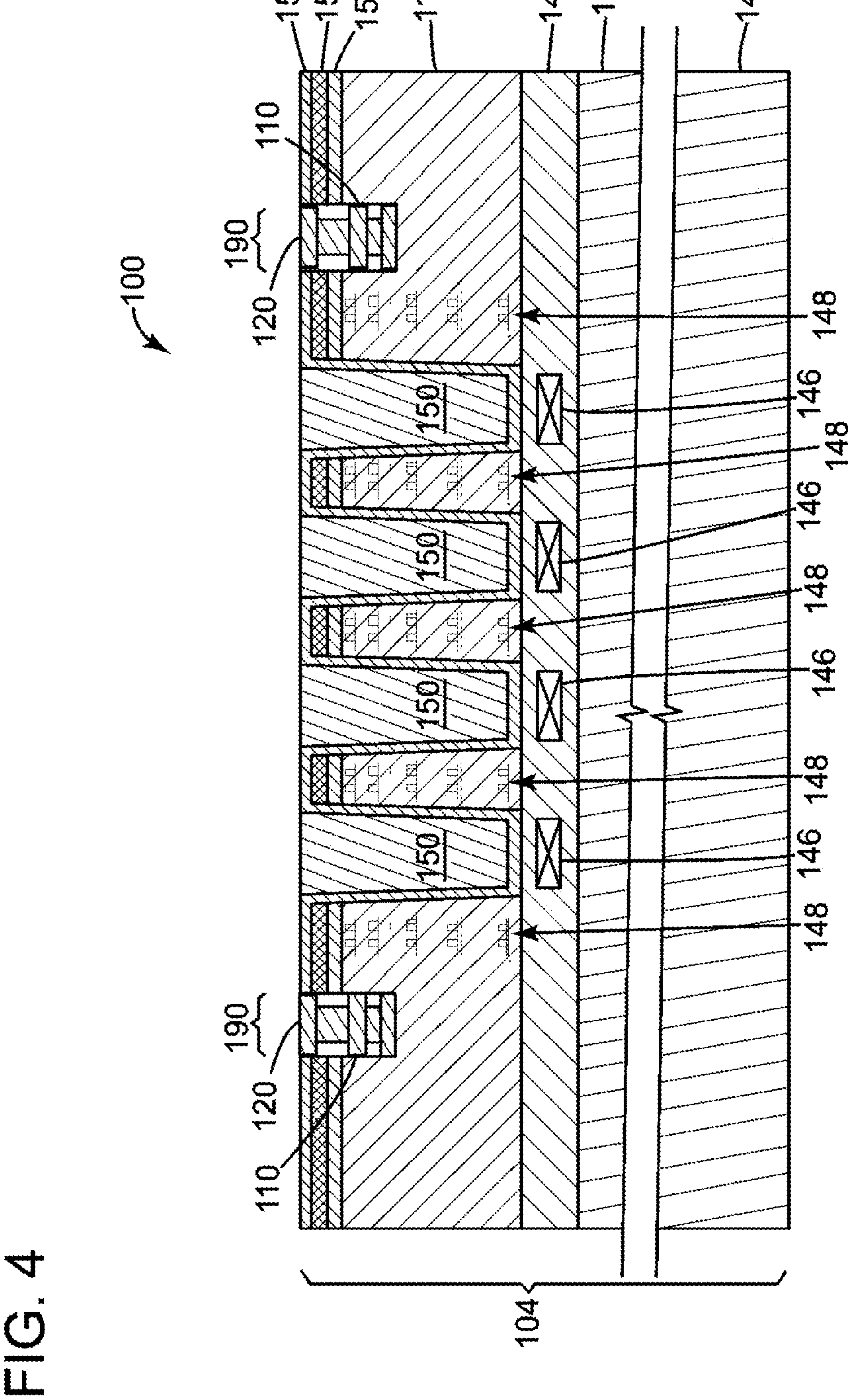
FIG. 4 is a simplified cross sectional view of the sensor system of FIG. 3, wherein the image sensor structure includes bond pads disposed in the device stack in accordance with one example disclosed herein.

Referring to FIG. 4, the bond pads 110 are disposed into the device stack 118. This may be done first by lithographically patterning and etching the device stack 118 to form bond pad apertures 190 in the device stack 118. Thereafter various layers of bond pad metals (not shown) may be disposed in the bond pad apertures 190 using any suitable disposing techniques, such as an ALD process, to form the bond pads 110.

Once the bond pad 110 is formed, its top surface 120 may be exposed for, and accessible to, electrical probing. The electrical probing enables a series of acceptance tests (such as continuity testing) on the sensor system 100.

Figure 5:
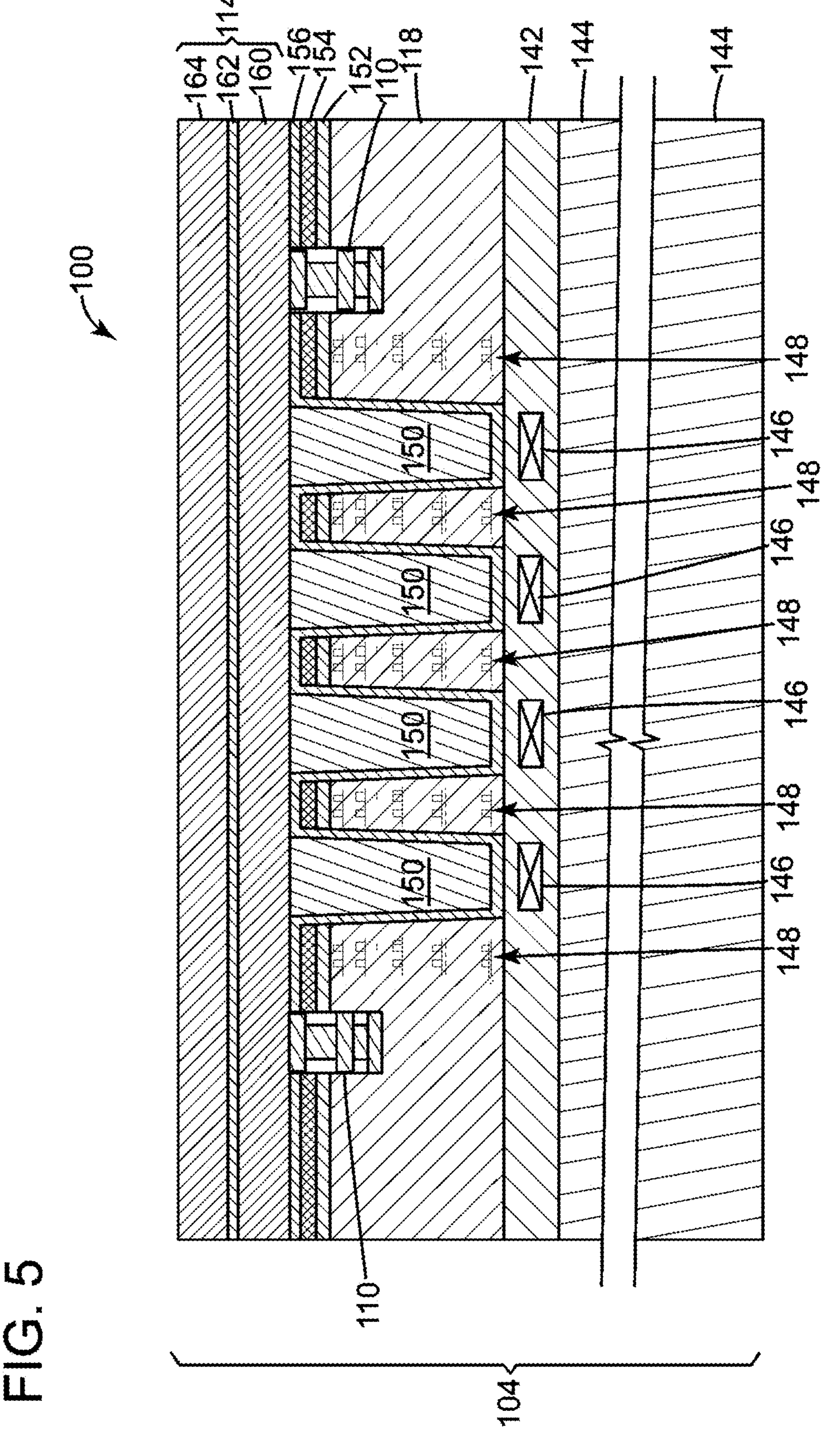
FIG. 5 is a simplified cross sectional view of the sensor system of FIG. 4, wherein the image sensor structure includes a passivation stack disposed over the device stack and the bond pads in accordance with one example disclosed herein.

Referring to FIG. 5, thereafter in the process flow, at least a portion of the passivation stack 114 is disposed over the device stack 118 and the bond pads 110. In the specific example illustrated in FIG. 5, $1^{st}$ passivation layer 160 is disposed over the array of light guides 150, such that the bottom surface 116 of the $1^{st}$ passivation layer 160 is in direct contact with the top surface 158 of the light guides 150. The $1^{st}$ chemical protection layer 162 can then be disposed over the $1^{st}$ passivation layer 160. The $2^{nd}$ passivation layer 166 can then be disposed over the $1^{st}$ chemical protection layer 162. Each of these processes can be done by any suitable deposition processes, such as CVD or PVD. The P t chemical protection layer 162 and $1^{st}$ and $2^{nd}$ passivation layers 160, 164 form at least a portion of the passivation stack 114. The portion of the passivation stack 114 may then coat the bond pads 110.

Figure 6:
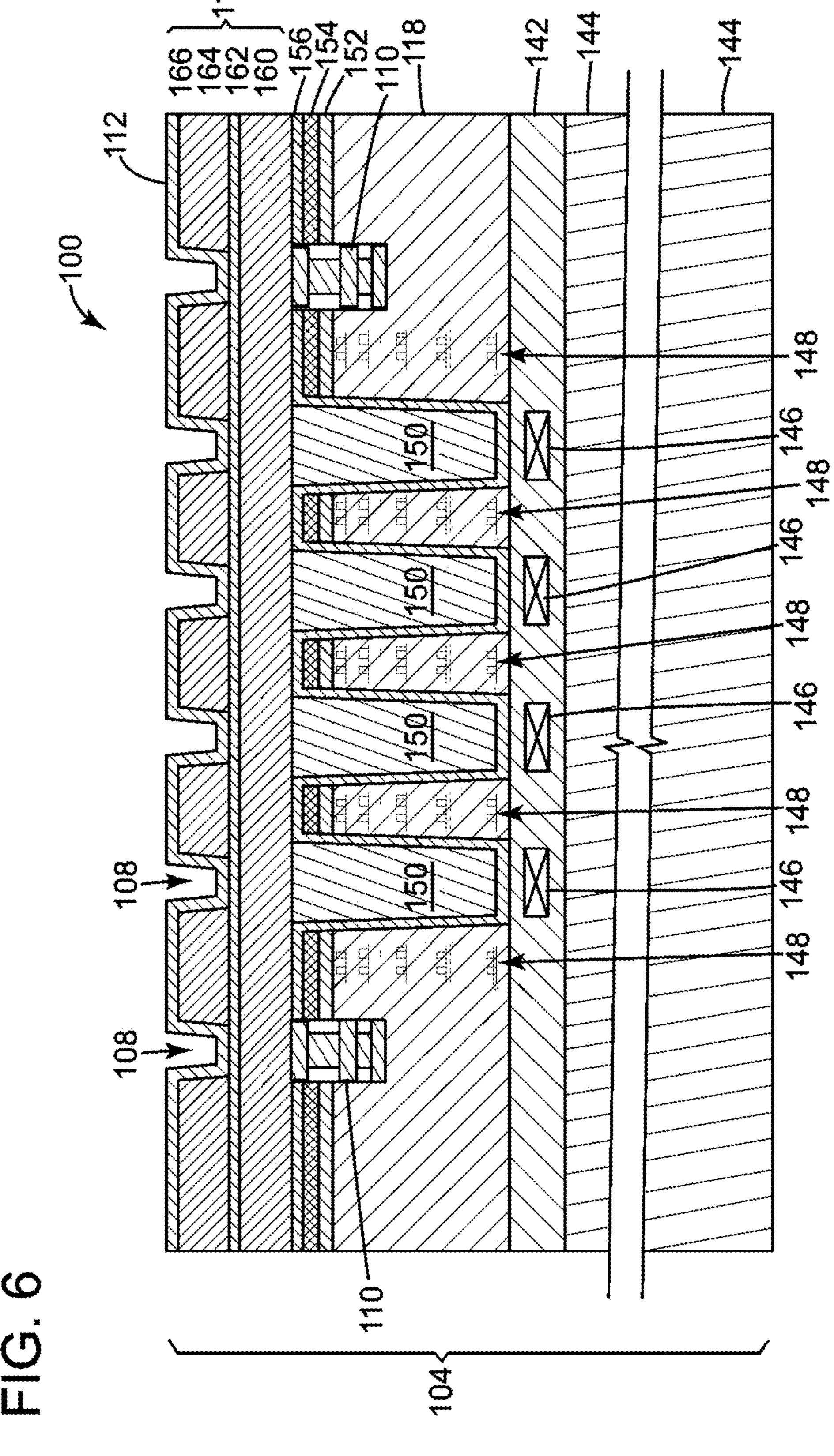
FIG. 6 is a simplified cross sectional view of the sensor system of FIG. 5, wherein the image sensor structure includes nanowells disposed into a top layer of the passivation stack in accordance with one example disclosed herein.

Referring to FIG. 6, thereafter in the process flow, the array of nanowells 108 is formed in a top layer 112 of the passivation stack 114. Each nanowell 108 being associated with a light guide 150 in the array of light guides.

In the specific example illustrated in FIG. 6, this is done by thereafter lithographically patterning and etching the array of nanowells 108 in the $2^{nd}$ chemical protection layer 164. Then disposing a $2^{nd}$ chemical protection layer 166 over the $2^{nd}$ passivation layer 164. The 2nd chemical protection layer 166 may be disposed using any suitable deposition processes, such as CVD, PVD or ALD.

The $2^{nd}$ chemical protection layer 166 is the top layer 112 of the passivation stack 114. The $2^{nd}$ chemical protection layer 166 conforms to the nanowells 108 that have been etched into the $2^{nd}$ passivation layer 164 to form the nanowells 108 in the top layer 112 of the passivation stack. 114.

Figure 7:
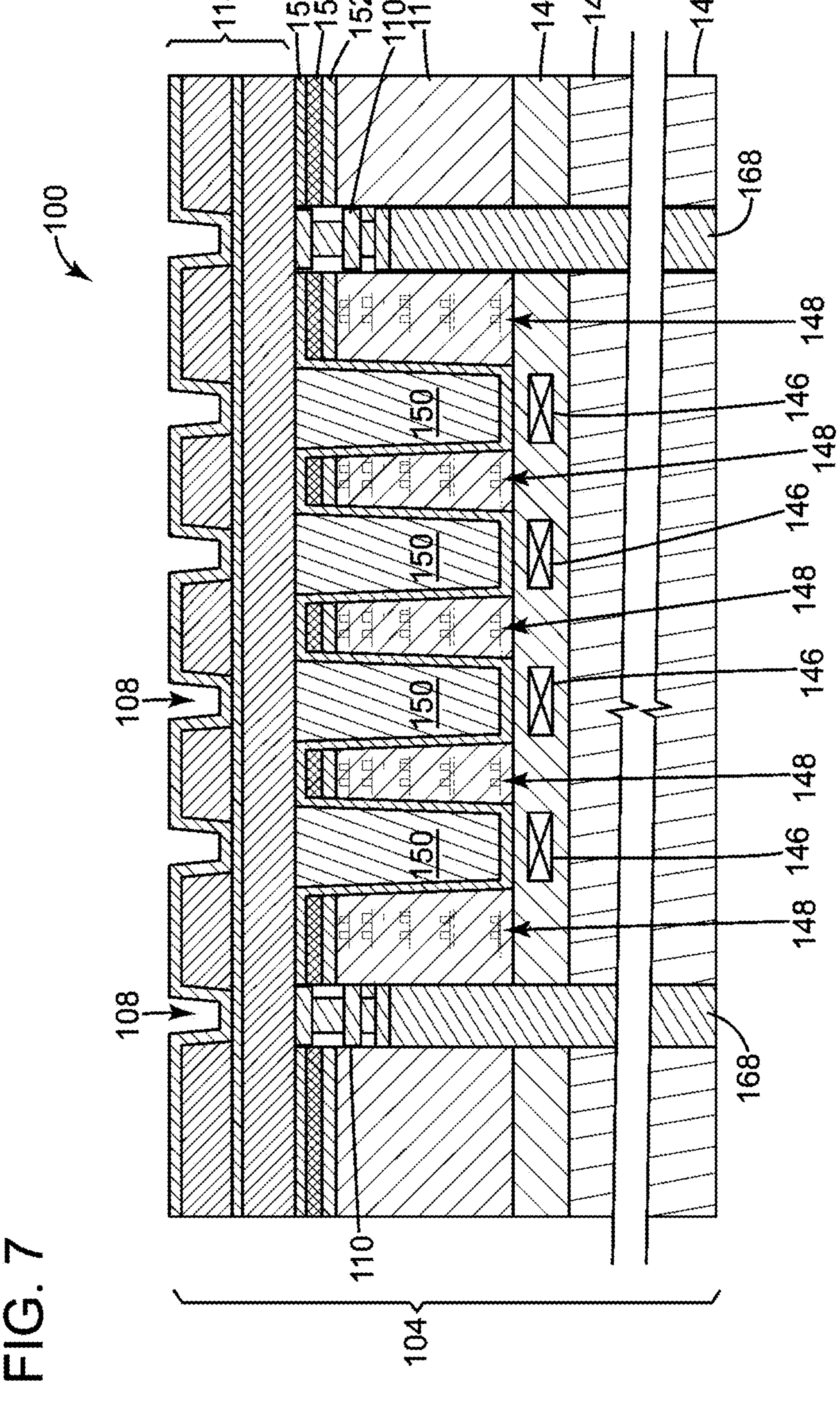
FIG. 7 is a simplified cross sectional view of the sensor system of FIG. 6, wherein the image sensor structure includes a through-silicon via (TSV) extending from a bottom surface of the base substrate to the bond pads in accordance with one example disclosed herein.

Referring to FIG. 7, thereafter in the process flow, the base substrate 144 is thinned to a predetermined thickness. This may be done by any suitable polishing processes, such as a chemical mechanical polishing (CMP) process or a grinding process.

Once thinned, TSV 168 are etched through the bottom surface 170 of the base substrate 144. The TSV 168 are etched to extend from the bottom surface 170 of the base substrate 144 to the bond pads 110. This can be done by any suitable etching processes, such as an RIE process.

The TSV 168 are then plated to make electrical contact with the bond pads 110. This may be done by any suitable plating processes, such as an electroplating process.

Figure 8:
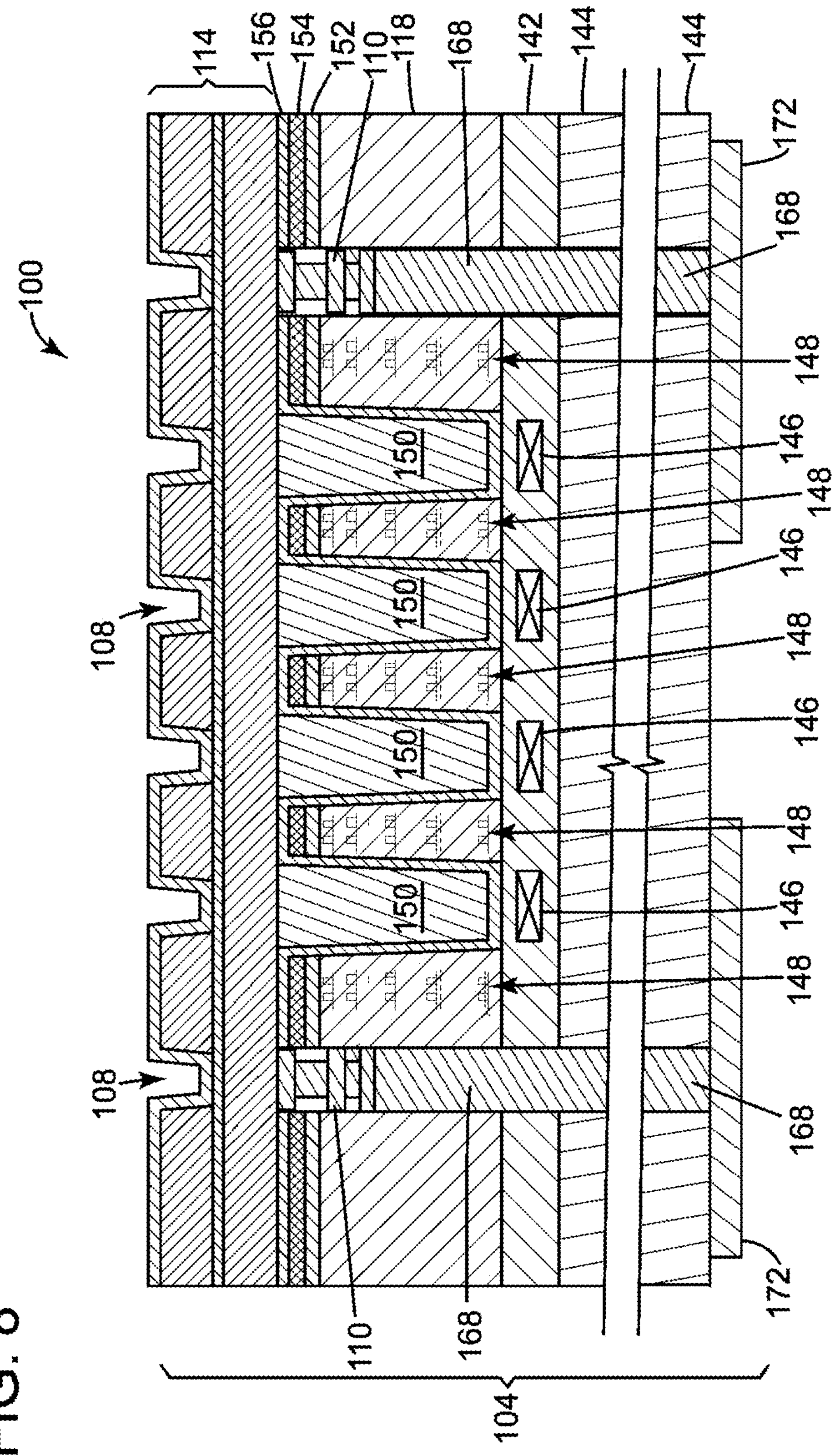
FIG. 8 is a simplified cross sectional view of the sensor system of FIG. 7, wherein the image sensor structure includes a redistribution layer (RDL) disposed on the bottom surface of the base substrate and in electrical contact with the TSV in accordance with one example disclosed herein.

Referring to FIG. 8, thereafter in the process flow, an RDL 172 is disposed on the bottom surface 170 of the base substrate 144. This can be done by first disposing the RDL 172 over the entire bottom surface 170, then lithographically patterning and etching the RDL to a predetermined shape.

Figure 9:
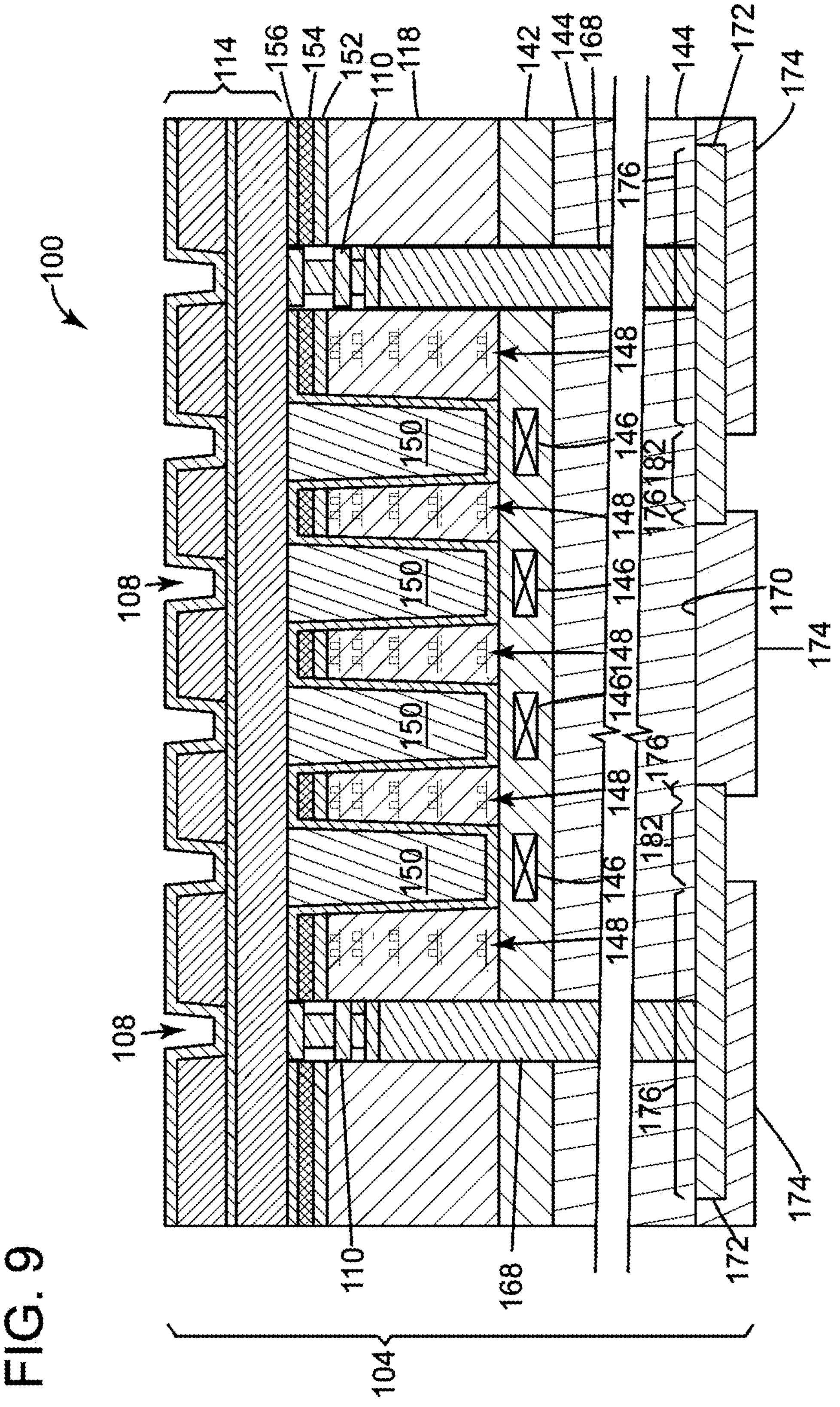
FIG. 9 is a simplified cross sectional view of the sensor system of FIG. 8, wherein the image sensor structure includes a first (1') environmental protection layer disposed over a $1^{st}$ portion of the RDL in accordance with one example disclosed herein.

Referring to FIG. 9, thereafter in the process flow, a 1$^{st}$ environmental protection layer 174 is disposed over a 1$^{st}$ portion 176 of the RDL 172. This may be done by any suitable deposition processes, such as CVD or PVD. A 2$^{nd}$ portion 182 of the RDL 172 is left exposed as one or more bonding sites for wires 180 (best seen in FIG. 13).

Figure 10:
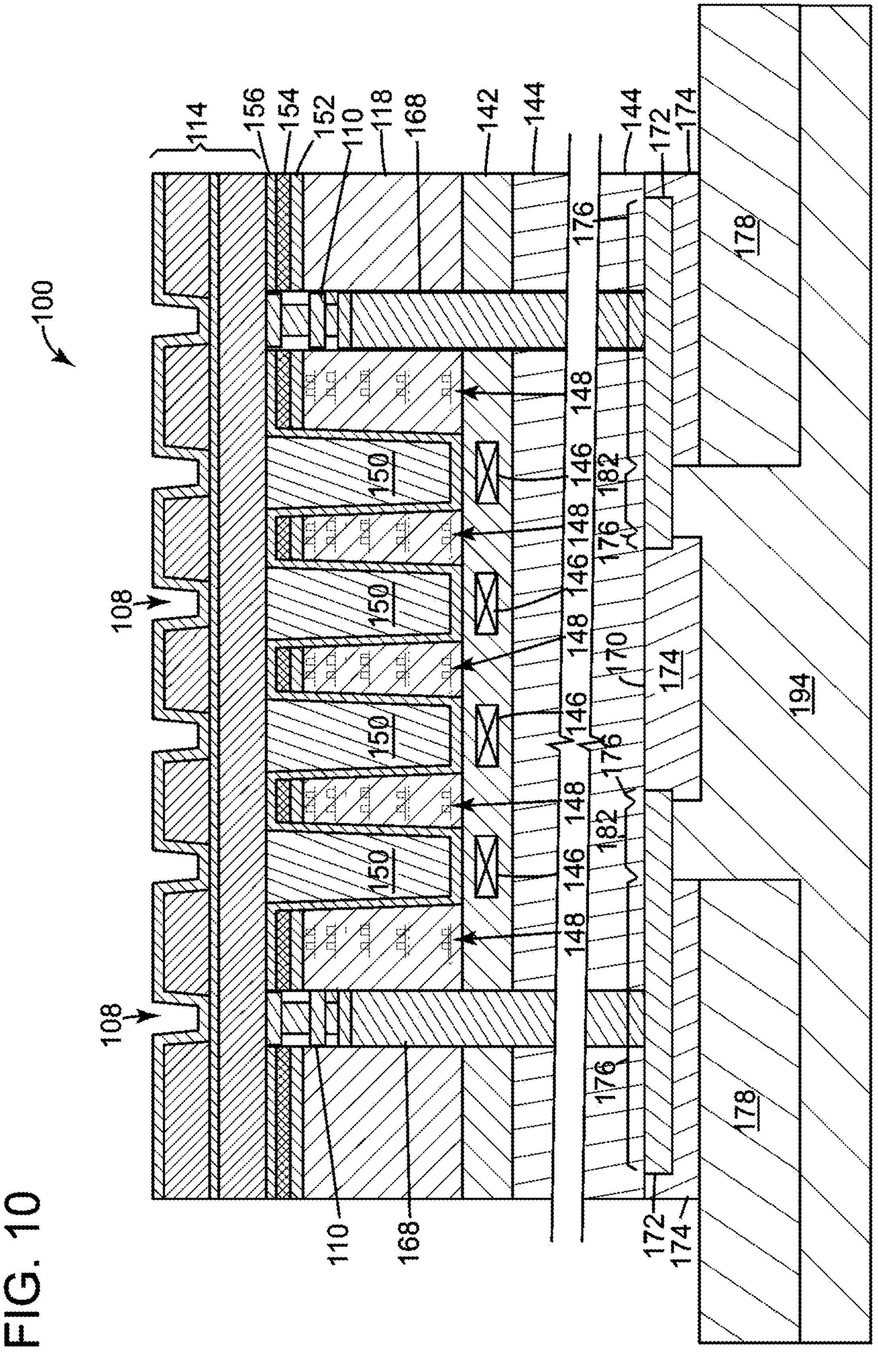
FIG. 10 is a simplified cross sectional view of the sensor system of FIG. 9, wherein the image sensor structure includes mechanical support structures bonded to the P t environmental protection layer and a temporary protection layer covering a second (2") portion of the RDL in accordance with one example disclosed herein.

Referring to FIG. 10, thereafter in the process flow, mechanical support structures 178 are bonded over the 1$^{st}$ environmental protection layers 174. This may be done by physical bonding, such as by adhesives or other mechanical bonding processes.

Thereafter a temporary protective layer 194 is disposed over the exposed 2$^{nd}$ portions 182 of the RDL 172 to protect these 2$^{nd}$ portions 182 during subsequent processing of the sensor system 100. The temporary protective layer 194 may be composed of a resist material. The temporary protective layer 194 may also be disposed by utilizing several temporary processes including, but not limited to, bonding a tape, a glass or a silicon wafer through a layer of pressure sensitive adhesive that is removable. The temporary protection layer 194 may also come in the form of solvent soluble wax coatings.

Figure 11:
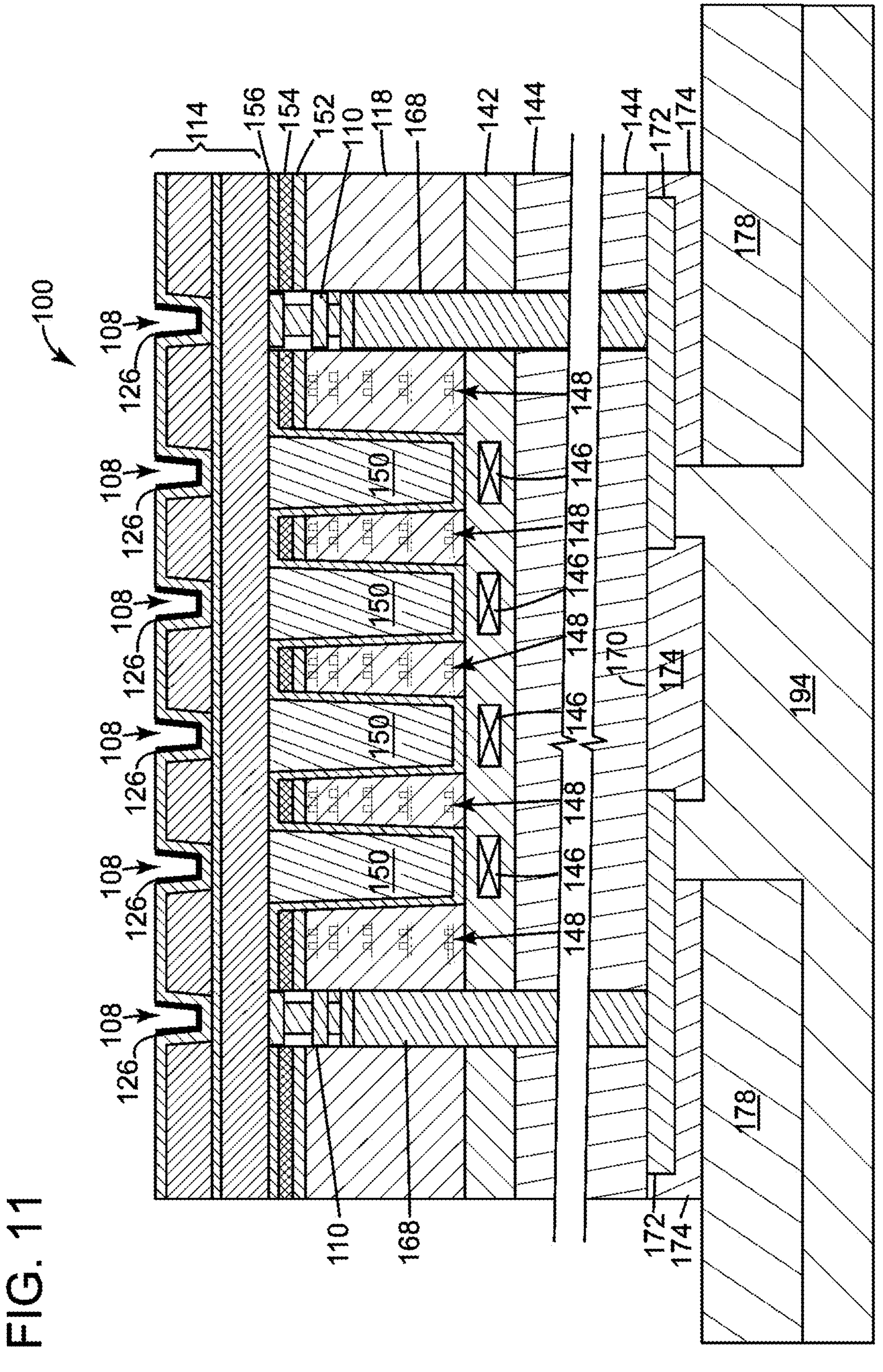
FIG. 11 is a simplified cross sectional view of the sensor system of FIG. 10, wherein the image sensor structure includes a hydrogel layer disposed within the nanowells in accordance with one example disclosed herein.

Referring to FIG. 11, thereafter in the process flow, a hydrogel layer 126 is disposed in the nanowells 108. The hydrogel layer may be composed of any suitable polymers, such as silane-free acrylamide (SFA) polymer, methacrylamide, hydroxyethly methacrylate or N-vinyl pyrrolidinone. Several processes may be utilized for this overall deposition process, including, but not limited to:

spin coating the top layer 112 of the passivation stack 114 with hydrogel 126;

curing the hydrogel 126; and

CMP down the hydrogel 126 so that it is disposed at least substantially on the inner surfaces of the nanowells 108.

Referring to FIG. 12, thereafter in the process flow, the flow cell 102 is disposed upon the top layer 112 of the passivation stack 114 to form the flow channel 106 therebetween, such that the flow channel is disposed over the array of nanowells 108 and the bond pads 110. This can be done by any suitable bonding processes, such as adhesive bonding or other bonding processes.

Referring to FIG. 13, thereafter in the process flow, the temporary protective layer 194 can be removed to expose the 2$^{nd}$ portion 182 of the RDL 172. This can be done by any suitable removal processes, such as resist stripping or wet or dry etching.

Thereafter wires 180 may be bonded to the 2$^{nd}$ portion 182 of the RDL 172, such that the bonded wires 180 are in electrical contact with the RDL 172 through wire bonds 184. This may be done by forming a eutectic metal bond through wire bonding, by solder bump bonding to form a solder bump wire bond 184 or by using other wire bonding processes.

Referring to FIG. 14, thereafter in the process flow, the 2$^{nd}$ environmental protection layer 186 is disposed over the 2$^{nd}$ portion 182 of the RDL 172. The 2$^{nd}$ environmental protection layer 186 and the P t environmental protection layer 174 entirely covering the RDL 174. This may be done by any suitable deposition processes, such as CVD or PVD.

The 1$^{st}$ and 2$^{nd}$ environmental protection layer 174, 186 also stabilize and protect the wires 180 and wire bonds 184 attached to the RDL 174. Additionally, the deposition of the 2$^{nd}$ environmental protection layer completes the formation of the sensor system 100.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

Although the foregoing examples have been described by reference to specific examples, it should be understood that numerous changes may be made within the spirit and scope of the inventive concepts described. Accordingly, it is intended that the examples not be limited to the described examples, but that it have the full scope defined by the language of the following claims.

What is claimed is:

1. A method comprising:

radiating excitation light onto an image sensor structure, the image sensor structure comprising:

an image layer disposed over a base substrate and comprising an array of light detectors, a device stack disposed over the image layer and comprising an array of light guides;

a bond pad disposed in the device stack;

a passivation stack disposed over the device stack and the bond pad and comprising an array of nanowells;

a plated through-silicon via (TSV) extending through a bottom surface of the base substrate and to the bond pad; and a flow cell disposed over the passivation stack, wherein the passivation stack is disposed between the flow cell and the bond pad, wherein the radiating excitation light causes data signals to be transmitted from at least one of the light detectors and through the bond pad and TSV.

2. The method of claim 1, wherein the radiating excitation light causes emissive light to emanate from at least one of the nanowells, and wherein the data signals are transmitted from at least one of the light detectors based on detected photons of the emissive light.

3. The method of claim 2, wherein at least some of the excitation light and the emissive light passes through the passivation stack and to at least one light guide of the array of light guides, and wherein the at least one light guide filters the excitation light and directs the emissive light to at least one associated light detector of the array of light detectors.

4. The method of claim 1, wherein the flow cell comprises a flow channel that is disposed over the array of nanowells and the bond pad, and wherein the method further comprises introducing a reaction fluid into the flow channel.

5. The method of claim 4, wherein the introducing the reaction fluid into the flow channel comprises passing the reaction fluid through at least one inlet port of a flow cell cover of the flow cell that is in communication with the flow channel.

6. The method of claim 5, wherein the introducing the reaction fluid into the flow channel comprises forming a flow of the reaction fluid through the flow channel that extends between the at least one input port and at least one outlet port of the flow cell cover that is in communication with the flow channel.

7. The method of claim 4, wherein the introducing the reaction fluid into the flow channel effectuates controlled reaction protocols between the reaction fluid and analytes disposed within the nanowells.

8. The method of claim 7, wherein the controlled reaction protocols bind fluorescently labeled molecules with the analytes.

9. The method of claim 8, wherein the radiating excitation light causes the fluorescently labeled molecules to fluoresce the emissive light, and wherein the data signals are transmitted from at least one of the light detectors based on detected photons of the emissive light.

10. The method of claim 9, wherein at least some of the excitation light and the emissive light passes through the passivation stack and to at least one light guide of the array of light guides, and wherein the at least one light guide filters the excitation light and directs the emissive light to at least one associated light detector of the array of light detectors.

11. The method of claim 9, further comprising analyzing the data signals to reveal properties of the analytes.

12. The method of claim 7, wherein the introducing the reaction fluid into the flow channel disposes the analytes within the nanowells.

13. The method of claim 1, wherein the image sensor structure further comprises a redistribution layer (RDL) on the bottom surface of the base substrate, the RDL being in electrical contact with the TSV, and wherein the data signals are further transmitted through the RDL.

14. The method of claim 13, wherein the image sensor structure further comprises:

a $1^{st}$ environmental protection layer disposed over a $1^{st}$ portion of the RDL;

mechanical support structures disposed over the $1^{st}$ environmental protection layer; and wire bonded in electrical contact with a $2^{nd}$ portion of the RDL.

15. The method of claim 14, wherein the image sensor structure further comprises a $2^{nd}$ environmental protection layer disposed over the $2^{nd}$ portion of the RDL.

16. The method of claim 1, wherein the passivation stack comprises:

a $1^{st}$ passivation layer disposed over the device stack and the bond pad;

a $1^{st}$ chemical protection layer disposed over the $1^{st}$ passivation layer; and a $2^{nd}$ passivation layer disposed over the $1^{st}$ chemical protection layer.

17. The method of claim 16, wherein the nanowells are formed at least in part by the $2^{nd}$ passivation layer.

18. The method of claim 16, wherein the passivation stack further comprises a $2^{nd}$ chemical protection layer disposed over the $2^{nd}$ passivation layer.

19. The method of claim 1, wherein the image sensor structure further comprises a light shield layer disposed over the device stack, where the light shield layer is disposed between the device stack and the passivation stack.

20. The method of claim 19, wherein the bond pad extends through the light shield layer.

* * * * *